(12) United States Patent
Okuda

(10) Patent No.: US 8,313,034 B2
(45) Date of Patent: Nov. 20, 2012

(54) SEMICONDUCTOR DEVICE AND RFID TAG CHIP

(75) Inventor: Yuichi Okuda, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 578 days.

(21) Appl. No.: 12/556,045

(22) Filed: Sep. 9, 2009

(65) Prior Publication Data

US 2010/0090014 A1    Apr. 15, 2010

(30) Foreign Application Priority Data

Oct. 10, 2008  (JP) ................ 2008-263596

(51) Int. Cl.
*G06K 19/06* (2006.01)
*G05F 3/16* (2006.01)
*G05F 1/10* (2006.01)
*G05F 3/02* (2006.01)
*G11C 5/14* (2006.01)

(52) U.S. Cl. ........ 235/492; 323/313; 323/314; 323/907; 327/530; 327/538; 327/540; 327/542; 327/543

(58) Field of Classification Search .......... 235/492; 323/313–314, 907; 327/530, 538–540, 542–543
See application file for complete search history.

(56) References Cited

U.S. PATENT DOCUMENTS

| 7,348,834 B2* | 3/2008 | Itoh ................ 327/539 |
| 7,786,870 B2* | 8/2010 | Zettler ................ 340/572.4 |
| 2004/0155636 A1* | 8/2004 | Fukui et al. ........ 323/281 |

* cited by examiner

*Primary Examiner* — Michael G Lee
*Assistant Examiner* — Laura Gudorf
(74) *Attorney, Agent, or Firm* — Mattingly & Malur, PC

(57) ABSTRACT

The present invention provides a reference power supply circuit which does not require trimming and prevents occurrence of deadlock of a band gap reference circuit. An RFID tag chip related to the present invention has a reference power supply including a switch for switching between a band gap reference circuit and a Vth difference reference circuit. A reference potential in band gap reference of the band gap reference circuit and an output of the Vth difference reference circuit are compared by a comparator, and a transistor operating as a switch is controlled, thereby making the reference potential in band gap reference rise, hastening startup of the band gap reference circuit, and preventing occurrence of deadlock in the band gap reference circuit.

10 Claims, 17 Drawing Sheets

SEMICONDUCTOR DEVICE AND RFID TAG CHIP

CROSS-REFERENCE TO RELATED APPLICATIONS

The disclosure of Japanese Patent Application No. 2008-263596 filed on Oct. 10, 2008 including the specification, drawings and abstract is incorporated herein by reference in its entirety.

BACKGROUND OF THE INVENTION

The present invention relates to a constant voltage circuit for use in an RFID tag chip or the like and, more particularly, to a process of starting power at the time of start-up.

In recent years, the number of chips operating on power received from electric waves is increasing. One of such chips is an RFID tag chip (hereinbelow, called RFID tag chip). One of uses of the RFID tag chip is to identify a person or object by radio.

Basically, unique numbers are assigned to all of RFID tag chips. A reader/writer can read a unique number by radio communication. Since the operation of associating numbers and chips is performed on the reader/writer side, an RFID tag chip itself does not have a complicated function. According to a demand, an RFID tag chip has only the function of outputting a number assigned to the chip. Some products have the function of storing information and the security function.

The functions of an RFID tag chip are relatively simple. However, when it is assumed that the RFID tag chip is used in place of a bar code, the RFID tag chip is demanded to be producible at very low lost. In 2008, the immediate goal of the manufacturing cost of the RFID tag chip is about 5 yen per unit.

Since the RFID tag chips operate on electromotive force of electric waves, many of the RFID tag chips have to operate at very low power consumption.

Many RFIDs use electric waves in the bands of 13.56 MHz, 900 MHz, and 2.4 GHz. A main target of the present invention is a standard called EPC Global Class 1 Generation 2 (C1G2 or EPC Gen2) used mainly in the 900 MHz band. Introduction of the standard started in major retailers in all over the U.S.A. and major electronics retail stores in Japan and is already a de facto standard. At present, the standard is mainly applied in distribution. The market scale when an RFID tag is attached to each commodity in future is large.

An RFID tag conformed with the EPC Gen2 can make communication with a distance of 3 m or longer using electric waves of 900 MHz. Based on this point, there are some technical characteristics. First, considering the communication distance of 3 m, the RFID tag has to operate on very low current. The entire chip has to operate on a current of about 10 μA.

Considering mechanical strength when a tag chip is used as an inlet, desirably, the tag chip has a size of a certain degree of area.

Due to the above, as reference power circuits employed for a general RFID tag chip, a BGR (Band Gap Reference) circuit and a threshold-difference-using-type reference voltage generating circuit (Vth difference reference circuit) exist. The circuits are used since they are relatively cheap and their mount areas are small.

SUMMARY OF THE INVENTION

However, attention cannot be paid only to reduction in manufacturing cost of the circuits. When an RFID tag chip is provided as a product, mounting costs and test costs also exist. To supply an RFID tag chip at low cost, it is important to reduce also those costs.

The tests on an RFID tag chip are roughly divided into 1) filtering of improper products and 2) trimming. As for trimming, it is difficult to trim a plurality of chips at the same time. By using circuits having smaller manufacture variations, the trimming cost is suppressed. By the suppression, it is expected that the effect of reducing the test cost is increased. From this viewpoint, since the Vth difference reference circuit as one of the reference power circuits has to be trimmed, it seems preferable to use the BGR circuit.

The BGR circuit, however, has another problem.

A chip operating on power supplied from an RF such as an RFID tag chip has to generate a control circuit for an internal power supply Vdd by Vdd itself. A problem occurs particularly at the startup of Vdd. When a reference potential for controlling the internal power supply is generated by the BGR circuit, at a low power supply voltage at the startup of Vdd, an output of the BGR circuit becomes 0V. Consequently, a regulator for controlling the internal power supply controls Vdd toward 0V. Due to this, there is the possibility that a deadlock occurs such that 1) Vdd does not start, 2) the BGR circuit does not start, 3) Vdd is controlled toward 0V, and 4) Vdd does not start (it will be specifically described later with reference to FIG. 7).

An object of the present invention is to provide a stable high-precision reference power supply circuit requiring no trimming and preventing occurrence of deadlock of a BGR circuit.

The above and other objects and novel features of the present invention will become apparent from the description of the specification and the appended drawings.

Outline of representative inventions disclosed in the present application will be briefly described as follows.

A reference voltage generating circuit related to a representative embodiment of the present invention includes a band gap reference circuit, a threshold-difference-using-type reference voltage generating circuit, and a switch for switching between an output of the band gap reference circuit and an output of the threshold-difference-using-type reference voltage generating circuit. The switch switches between an output of the threshold-difference-using-type reference voltage generating circuit and an output of the band gap reference circuit in accordance with an input switch signal.

The switch signal of the reference voltage generating circuit may be output from a band gap reference switching control circuit, and the band gap reference switching control circuit may detect an input clock signal and switch the switch signal.

The reference voltage generating circuit may further include: a comparator for detecting a potential difference between an output of the threshold-difference-using-type reference voltage generating circuit and a reference potential in a band gap reference of the band gap reference circuit; and a transistor. When the reference potential in the band gap reference is smaller than the output of the threshold-difference-using-type reference voltage generating circuit, current flows in the transistor to increase the reference potential in the band gap reference.

The band gap reference circuit of the reference voltage generating circuit outputs a reference voltage of a reference oscillation circuit by using the reference potential in the band gap reference.

An RFID tag chip including the reference voltage generating circuit, using an output of the reference voltage generating circuit as a reference voltage of a regulator, and outputting a power supply voltage from a rectifier circuit is also in the scope of the present invention.

An effect obtained by the representative ones of the inventions disclosed in the application will be briefly described as follows.

In a reference power supply circuit related to a representative embodiment of the invention, trimming and a trimming circuit is unnecessary. As a result, the mounting area of the reference power supply circuit can be reduced, and reduction in the area and volume of an RFID tag chip can be expected.

Since trimming of the reference power supply circuit is unnecessary, test time and the man-hour related to the trimming is not required.

DETAILED DESCRIPTION OF THE PREFERRED EMBODIMENTS

Embodiments of the present invention will be described below with reference to the drawings.

First Embodiment

Figure 1A:
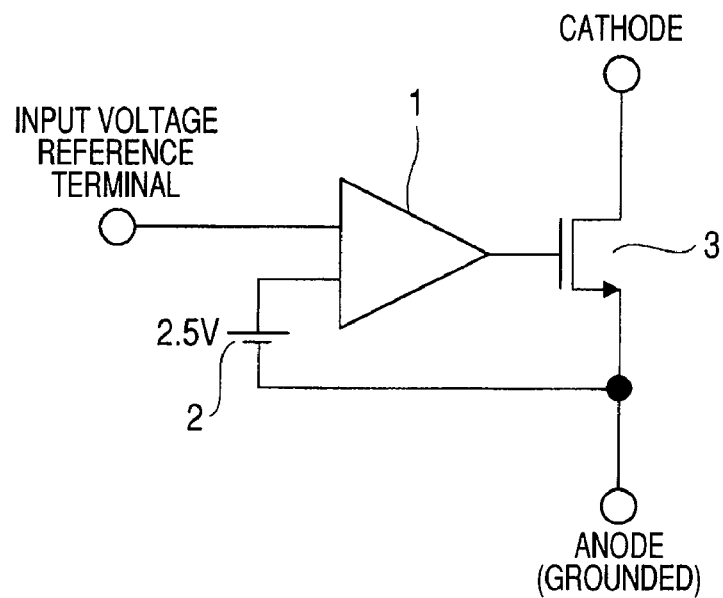
FIGS. 1A and 1B are circuit diagrams showing the configuration of a shunt regulator as a kind of a constant voltage circuit.
Figure 1B:
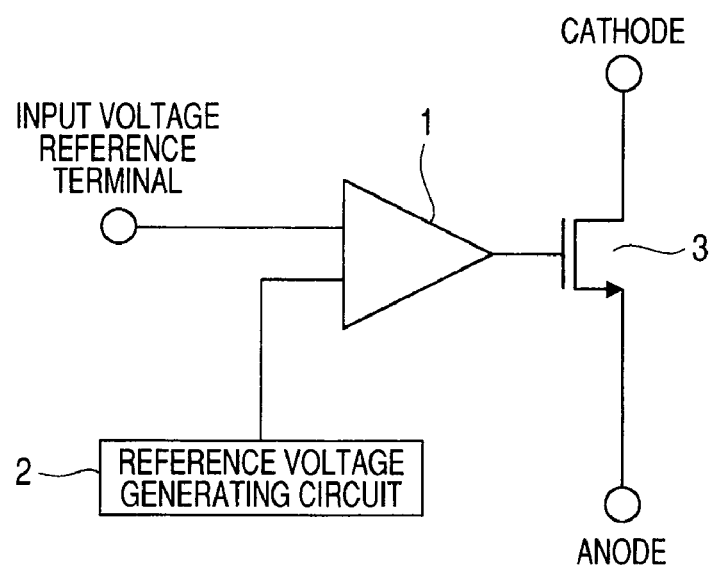

FIGS. 1A and 1B are circuit diagrams showing the configuration of a shunt regulator as a kind of a constant voltage power supply circuit. FIG. 1A shows the configuration of a constant voltage power source circuit used for a stationary device having a stable power source supplied from the outside, and FIG. 1B illustrates the configuration of a constant voltage power source circuit of a device that generates a power source voltage from an electric wave or the like, such as a noncontact RFID tag chip as an object of the present invention.

A shunt regulator of FIG. 1A has an amplifier 1 functioning as a comparator, a MOS-FET 3 in which gate voltage changes according to an output of the amplifier 1, and a reference voltage source 2' as a reference in comparison in the amplifier 1. In the case where an apparatus itself does not have a power supply like an RFID tag chip, it is unpreferable to provide a reference voltage source. Therefore, it is requested to generate a reference voltage itself by the apparatus itself.

FIG. 1B illustrates the configuration of a shunt regulator used in an RFID tag chip. Specifically, the shunt regulator generally has a reference voltage generating circuit 2 in place of the reference voltage source 2' and generates a reference voltage from small power based on an electric wave received via an antenna.

Figure 2:
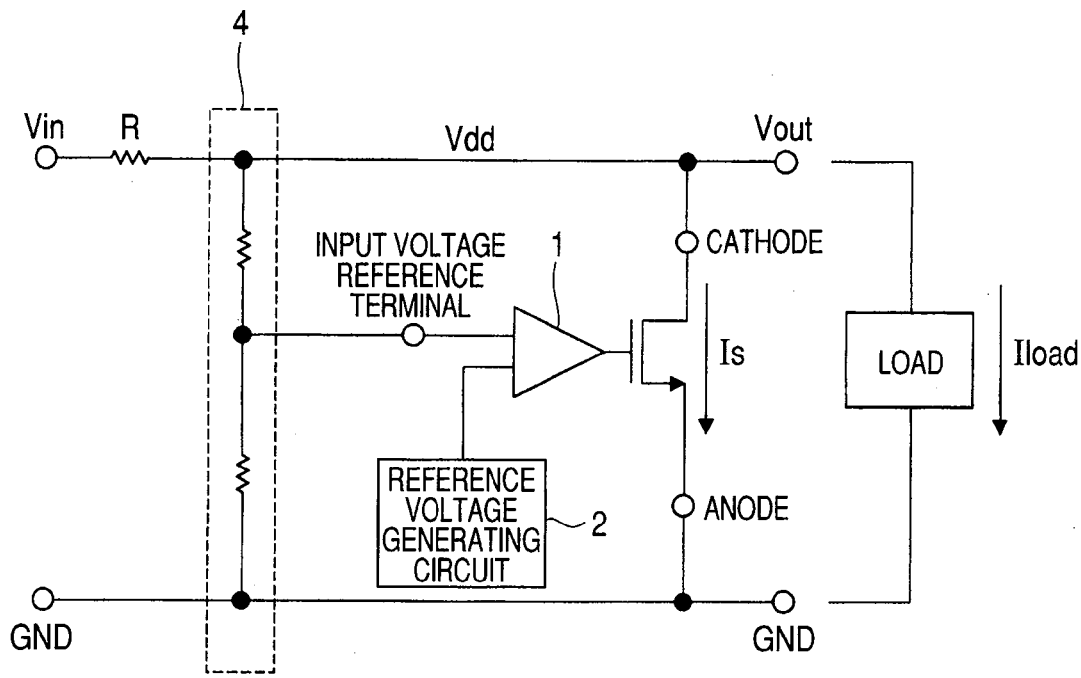
FIG. 2 is a circuit diagram showing the configuration of a power system of an RFID tag chip having the shunt regulator illustrated in FIG. 1B.

FIG. 2 is a circuit diagram illustrating the configuration of a power system of an RFID tag chip having the shunt regulator illustrated in FIG. 1B. Specifically, current extracted by a rectifier circuit is coupled to an internal voltage Vdd via a resistor. A voltage to be compared is applied from a voltage dividing circuit 4 between Vdd and GND to an input voltage reference terminal in the shunt regulator 1. The voltage to be compared is compared with the reference voltage generated by the reference voltage generating circuit 2.

The difference of the voltages compared is amplified by the amplifier 1 and coupled to the gate terminal of the MOS-FET 3. The voltage applied to the MOS-FET 3 controls the current flowing in the MOS-FET 3. Concretely, when the potential of Vdd rises, a control is performed to increase current Is flowing between the anode terminal and the cathode terminal of the shunt regulator so as to decrease Vdd. On the other hand, when Vdd drops, a control is performed to decrease the current Is flowing between the anode terminal and the cathode terminal of the shunt regulator so as to increase Vdd.

The characteristic of the control method is that when sufficient power is supplied, the sum of a load current Iload and the current Is is constant. In the case of extracting power from RF and performing operation, communication from a tag to a reader/writer is often performed by making the load of an antenna fluctuate. Consequently, when the load on the inside fluctuates, there is a case that it is regarded as communication from the tag to the reader/writer. To avoid the problem, in the RFID tag chip, in many cases, a shunt regulator is used.

Figure 3:
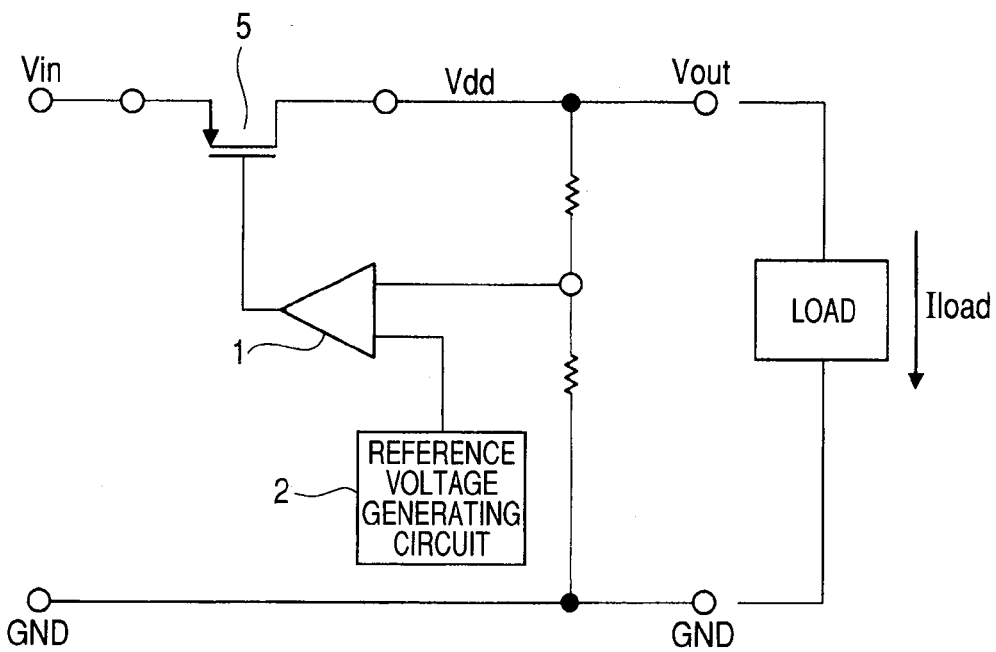
FIG. 3 is a circuit diagram showing the configuration of a power system of an RFID tag chip having a series regulator.

On the other hand, a similar power system can be also configured by using a series regulator. FIG. 3 is a circuit diagram showing the configuration of a power system of an RFID tag chip having a series regulator.

In the case of a series regulator, the gate terminal of a driver MOS 5 in the series regulator which is coupled to a load in series is controlled. When the potential of Vdd rises, a control is performed to decrease the current drive force of the driver MOS 5 so as to decrease Vdd. On the other hand, when the potential of Vdd drops, a control is performed to increase the current drive force of the driver MOS 5 so as to increase the potential of Vdd.

In the case of the shunt regulator of FIGS. 1A and 1B, a voltage drop of an amount corresponding to the load current Iload×resistor R (resistance immediately after an input terminal Vin in FIG. 2) occurs. On the other hand, in the series regulator, Vds in the driver MOS can be made very small. There is an advantage that power efficiency is higher than that of the shunt regulator.

In any of the cases, for use in an RFID tag chip, a reference voltage has to be generated by the reference voltage generating circuit 2. The reference voltage is requested to be constant against the power supply voltage, temperature, and variations at the time of manufacture. As the reference voltage generating circuit 2, various methods can be applied. Generally, a Vth difference reference circuit and a BGR (Band Gap Reference) circuit are often used.

The Vth difference reference circuit is a reference voltage generating circuit called a threshold-difference-using-type reference voltage generating circuit. Depending on infrastructure conditions at the time of manufacture of a MOS, two kinds of MOS-FETs having different Vth can be manufactured. The Vth difference reference circuit is a reference voltage circuit using the Vth difference of two kinds of MOS-FETs having different Vth (in the case of FIG. 4, a low-Vth MOS-FET and a standard-Vth MOS-FET).

Figure 4:
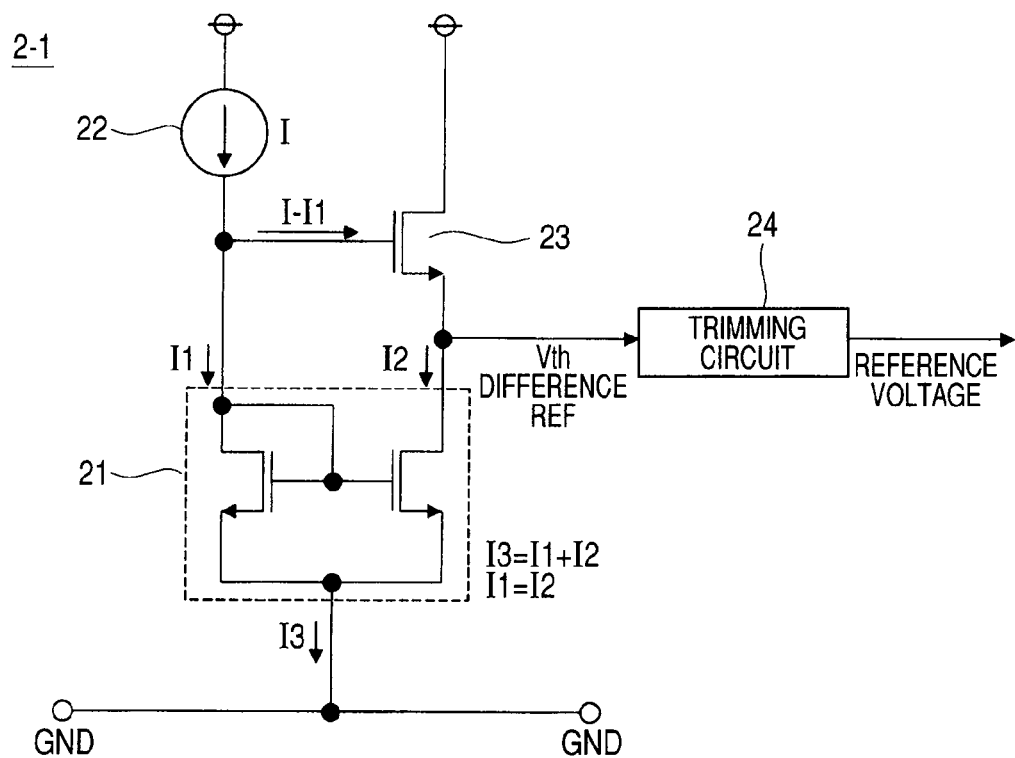
FIG. 4 is a circuit diagram showing a Vth difference reference circuit.

FIG. 4 is a circuit diagram showing a Vth difference reference circuit 2-1. The Vth difference reference circuit includes a current mirror circuit 21, a constant current source 22, a low-Vth MOS-FET 23, and a trimming circuit 24.

The current mirror circuit 21 is a direct current source circuit in which current applied to one of input terminals is reflected as it is in the other terminal. In FIG. 4, current I1 and a current I2 are equal to each other. The current mirror circuit 21 is configured by a standard Vth MOS-FET.

The constant current source 22 provides a current supplied to the current mirror circuit 21.

The low-Vth MOS-FET 23 is a transistor circuit for generating a low Vth to be compared with that of the standard-Vth MOS-FET as a component of the current mirror circuit.

The trimming circuit 24 is a circuit for adjusting an output of the Vth difference reference circuit 2-1. In manufacture of a MOS, transistors having relatively same properties can be manufactured, but it is difficult to obtain absolutely uniform performances. Consequently, by perform adjustment in the trimming circuit, product variations are dealt with.

The operation of the Vth difference reference circuit 2-1 will now be described.

The Vth difference of two kinds of MOS-FETs (the standard-Vth MOS-FET and the low-Vth MOS-FET 23 used in the current mirror circuit 21) of the Vth difference reference circuit 2-1 is constant regardless of temperature, current, and voltage. Therefore, when the same current is passed to the standard-Vth MOS-FET and the low-Vth MOS-FET 23 in the current mirror circuit 21 and the Vgs difference is obtained, the Vth difference output is resulted.

Figure 5:
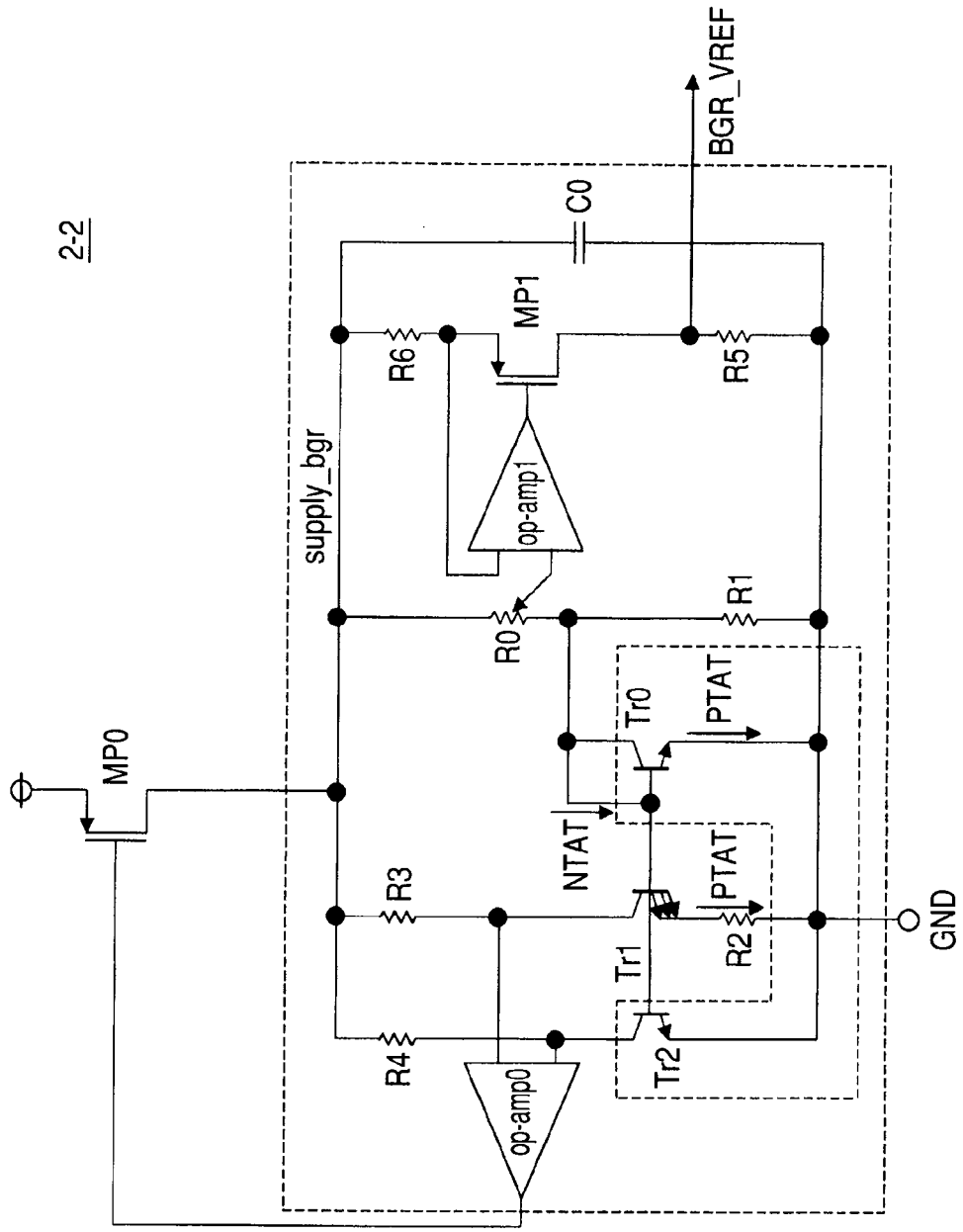
FIG. 5 is a circuit diagram showing a BGR circuit.

FIG. 5 is a circuit diagram expressing a BGR circuit 2-2. The BGR circuit 2-2 is designed so that PSRR (Power Supply Rejection Ration) for RFID becomes high.

First, by the potential of the base terminal of a MOS-FET (MP0), supply_bgr (reference potential in band gap reference) is controlled. As a result, current flowing in Tr0 and resistors R0 and R1 is determined.

op-amp0 denotes a comparator for comparing collector potentials of Tr1 and Tr2 and adjusting currents flowing in Tr1 and Tr2. op-amp0 is a component of an operational-amplifier-type band gap reference circuit. op-amp0 amplifies the potential difference and outputs the amplified difference to the gate terminal of the MOS-FET (MP0), thereby controlling currents flowing in Tr1 and Tr2.

As described above, op-amp0 operates so as to make the collector potentials of Tr1 and Tr2 the same potential. The current flowing in a resistor R2 becomes PTAT (proportional to absolute temperature) current having a characteristic of positive temperature proportional to the absolute temperature.

Since Tr0 and Tr2 configure a current mirror circuit, the current flowing in Tr0 also becomes the PTAT current.

On the contrary, a base-emitter voltage VBE of the transistor has a negative temperature characteristic. Consequently, the base potential of Tr0 also has the negative temperature characteristic. Accordingly, the current of the resistor R1 coupled to the base terminal of Tr0 also has the negative temperature characteristic.

By combining the current of the resistor R2 having the positive temperature characteristic to the resistor R1 having the negative temperature characteristic to cancel out the temperature characteristics, the temperature characteristic of the voltage drop in R0 can be made flat. In this case, the resistance ratio between the resistors R1 and R2 has to be properly selected.

On the other hand, op-amp1 controls a MOS-FET (MP1) so as to make the potential of the resistor R0 and that of a resistor R6 coincide with each other. By adjustment of the MOS-FET (MP1) with the resistor R0 and the ratio between a resistor R5 and the resistor R6, the potential of the BGR_VREF output having a flat temperature characteristic is determined.

The BGR circuit 2-2 has the following characteristics.
1) Variations in MOS are not related to circuit blocks that determine the PTAT current by Tr1, Tr2, and R2. Therefore, trimmingless operation is enabled.
2) Since the potential of the BGR_VREF output is determined by the resistance ratio of the resistors R5 and R6, low-voltage driving is possible.
3) The influence of the control of op-amp1 is not easily exerted on the control of op-amp0. Consequently, it is easy to shorten settling time and startup time can be shortened.
4) By setting the power supply potential of op-ampt1 to supply_bgr, elements coupled to Vdd can be set only to op-amp0 and the MOS-FET (MP0). As a result, the circuit can be designed with very high PSRR.

The Vth difference reference circuit and the method of generating two kinds of VREF of the BGR circuit have been described above. Both of them have drawbacks and advantages. The advantages of the Vth difference reference circuit are as follows.
   a) Since the circuit for generating the Vth difference is simple, the circuit operates on extremely low voltage.
   b) The startup is quick.
   c) Except for a trimming part, the circuit mounting area is small.

The drawbacks of the Vth difference reference circuits are as follows.
 a) Vth of the MOS-FET is known as a parameter having large manufacture variations, so that trimming is essential.
 b) Different from the BGR circuit, voltage/current having the temperature characteristic cannot be generated.

The advantages of the BGR circuit are as follows.
 a) Vbe of the transistor is constant as long as silicon is used, so that designing of extremely small manufacture variations can be carried out.
 b) Necessary elements are a MOS-FET, a resistor, and a diode, so that the circuit can be configured by standard process. It is preferable to include a transistor, but the circuit can be configured without a transistor.
 c) The voltages and currents having the temperature characteristics can be generated.

Drawbacks of the BGR circuit are as follows.
 a) A power supply voltage of a certain degree is necessary. With the power supply voltage or less, the output remains around 0V.
 b) The startup is slow.

Figure 6:
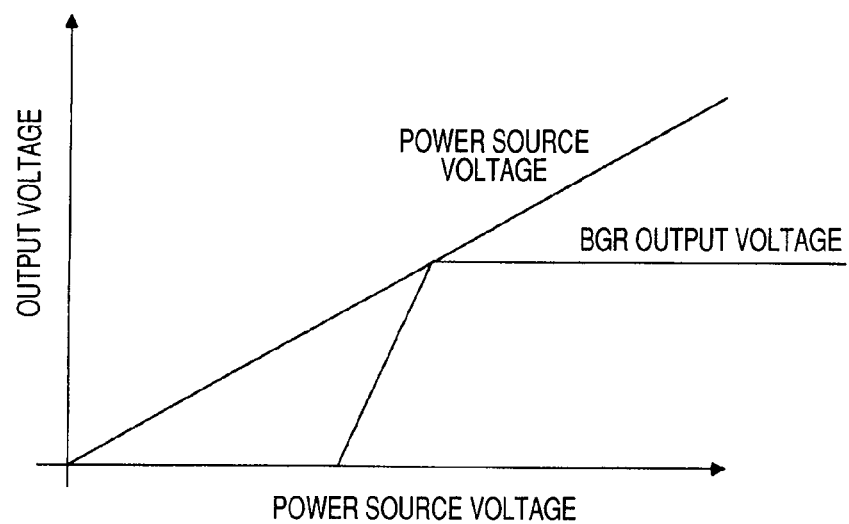
FIG. 6 is a graph showing changes in power supply potential and output potential in the case of employing the BGR circuit for generation of VREF.
Figure 7:
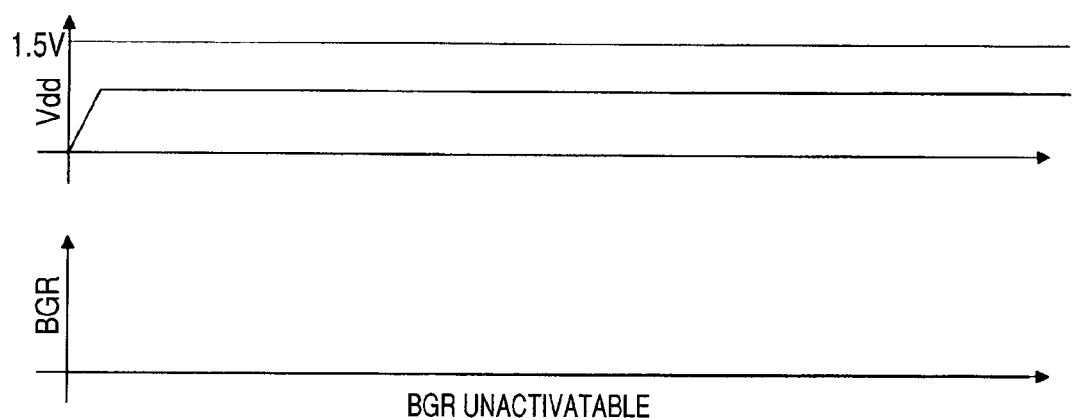
FIG. 7 is a graph for explaining problems in the case of employing the BGR circuit for generation of VREF.

In the case of employing the BGR circuit to generate VREF for a noncontact RFID tag chip and the like, there is the possibility that the following problems occur. FIG. 6 is a graph showing changes in the power supply potential and the output potential in the case of employing the BGR circuit for generation of VREF. FIG. 7 is a graph for explaining problems in the case where the BGR circuit is employed for generation of VREF.

As shown in the diagram, the power supply voltage characteristic of the BGR circuit is that, generally, in the case where there is no a predetermined power supply voltage or higher, the output remains at 0V. Due to this, in a chip which takes power from a high frequency signal and operates on the power such as an RFID tag chip, at the time of startup, a problem occurs as shown in FIG. 7.

First, when power is supplied from an antenna, rising of Vdd stops at a predetermined potential. This is because that Vdd is limited at the time of startup by a rectifying circuit so that Vdd does not exceed the withstand voltage even when the shunt regulator or series regulator does not operate. Since a limiter is designed so that Vdd does not exceed the withstand voltage even when the maximum power is received, rise of Vdd stops at a very low potential when the minimum power is received.

When the limiter operates and rise of Vdd stops, in the case where the potential does not reach the potential for operating the BGR circuit, the regulator controls Vdd toward 0V (in reality, Vdd does not drop to 0V in relation with a driver). In this case, a deadlock state occurs such that (1) the BGR circuit does not start, (2) the regulator controls Vdd toward 0V, (3) Vdd does not rise, and (4) the BGR does not start.

To prevent the deadlock state, it is considered to mount a strong startup circuit on the BGR circuit and design so that a potential is output from a very low voltage. However, even if the startup circuit is mounted, a problem as shown in FIG. 8 occurs.

Figure 8:
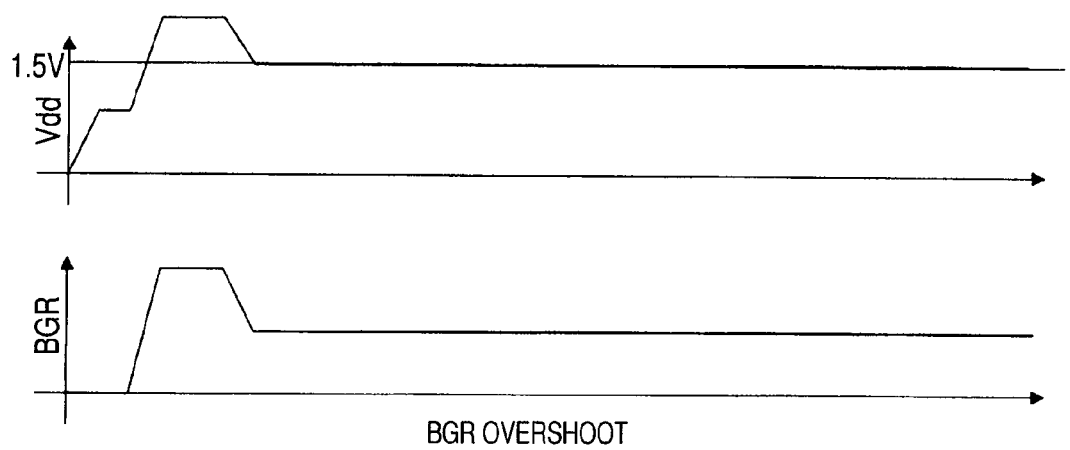
FIG. 8 is a graph for explaining problems at the time of mounting a startup circuit.

FIG. 8 is a graph explaining problems which occur when the startup circuit is mounted.

Depending on conditions that the noncontact RFID tag chip or the like operates, there is the possibility that an output of the BGR circuit largely overshoots due to the startup circuit. When the output of the BGR circuit overshoots, the potential of Vdd which is controlled by referring the output also overshoots. As a result, there is the possibility that Vdd exceeds the withstand voltage limit of a CMOS.

In actual mounting, it is difficult to design that the chip starts with reliability under all conditions of process variations, input power, temperature, and the like and that no overshoot occurs.

In contrast, in the case of employing the Vth difference reference for generation of VREF, the trimming circuit 24 is necessary and the test cost increases. Particularly, it is difficult to trim a number of chips in parallel, so that the test cost may increase.

Figure 9:
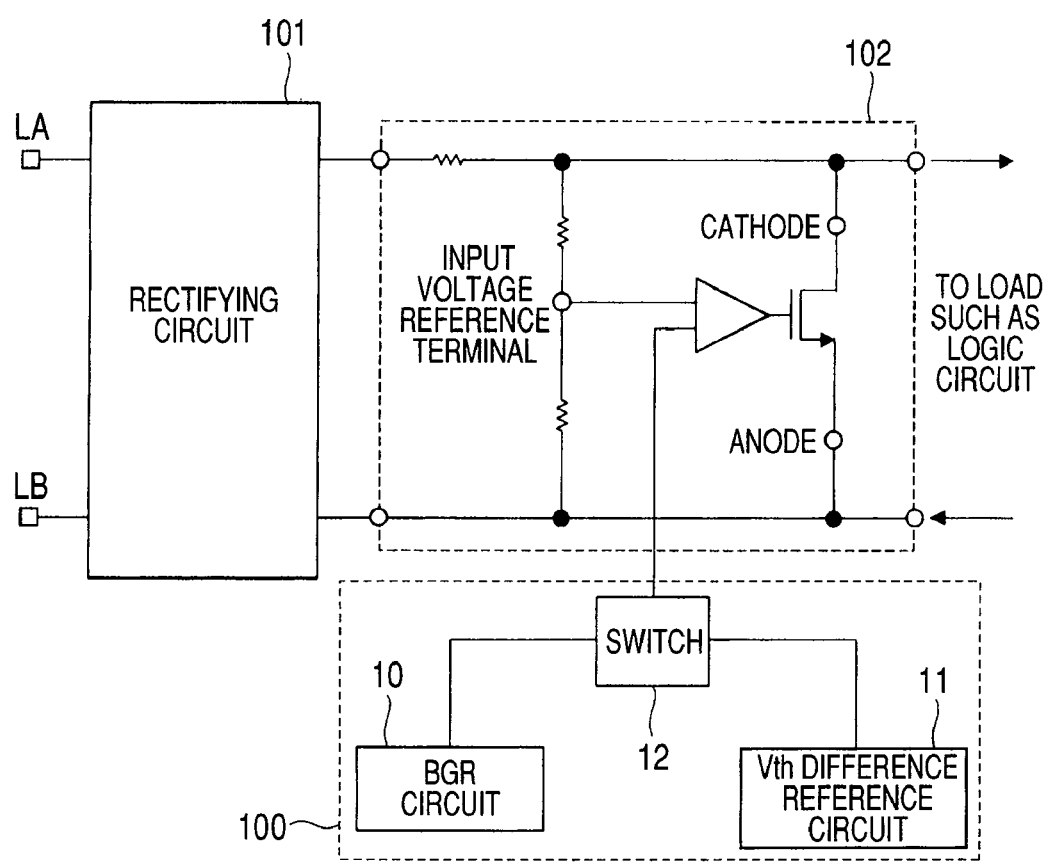
FIG. 9 is a block diagram of a power system of a noncontact RFID tag chip or the like related to a first embodiment of the invention.

A first embodiment of the present invention takes a measure against the problem. FIG. 9 is a block diagram showing a power system of a noncontact RFID tag chip or the like related to the first embodiment of the invention.

The power system includes a reference power supply 100, a rectifying circuit 101, and a regulator (in the embodiment, a shunt regulator) 102.

The reference power supply 100 is a circuit corresponding to the reference voltage generating circuit 2 in FIG. 1, which generates a reference voltage of the regulator. The reference power supply 100 includes a BGR circuit 10, a Vth difference reference circuit 11, and a switch 12. The reference power supply 100 supplies the reference voltage also to the other circuits included in the noncontact RFID tag chip and the like. Although circuits for this purpose are also included, they are not shown here.

The rectifying circuit 101 takes power from a radio frequency signal.

The regulator 102 is used to pass predetermined current to a load in the diagram. The operation of the regulator 102 is the same as that in FIG. 2 and its description will not be repeated.

Figure 10:
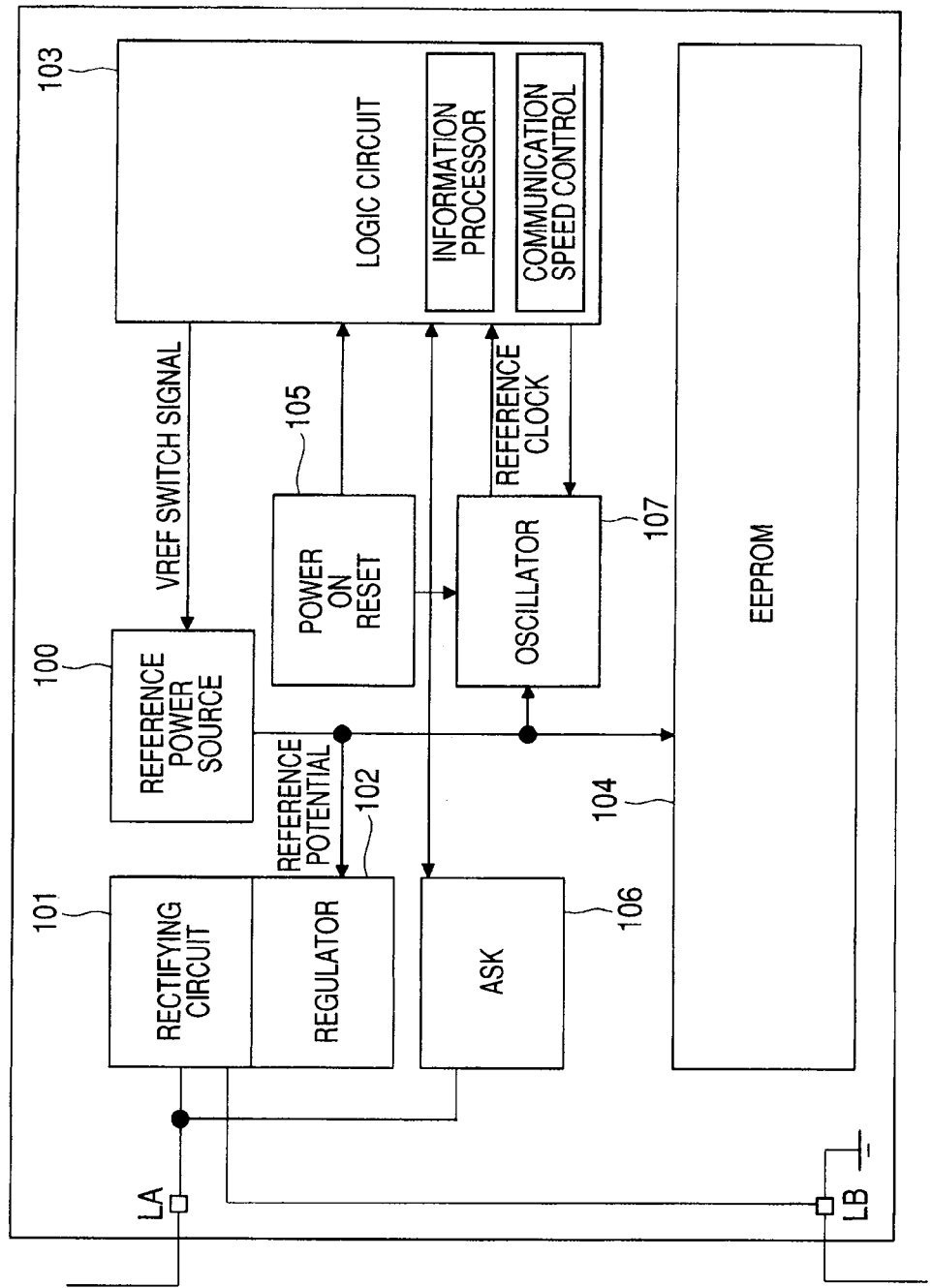
FIG. 10 is a block diagram showing the position in an RFID tag, of the power system of the noncontact RFID tag chip or the like related to the first embodiment of the invention.

FIG. 10 is a block diagram showing the position in an RFID tag, of the power system. In addition to the circuits of the power system, a logic circuit 103 for logic control, an EEPROM 104, a power-on-reset circuit 105 for a startup initializing circuit, an ASK circuit 106 for communication, and an oscillator 107 are included.

The logic circuit 103 is a circuit for executing an application process performed by the noncontact RFID tag. The circuit includes a VREF switching circuit 15 to be described with reference to FIG. 12, an information process circuit for an application process, and a communication speed control circuit for controlling communication speed.

The EEPROM 104 is a nonvolatile memory for recording data which is continuously held by the noncontact RFID tag.

The power on reset circuit 105 is a circuit for initializing a noncontact RFID tag. A device having a fixed power supply is not initialized as long as the power supply is turned off and turned on, the power supply of the noncontact RFID tag is always turned off/on at the time of communication with a tag reader. From this viewpoint as well, the importance of the power on reset circuit 105 can be understood.

An output of the power on reset circuit 105 is supplied to the logic circuit 103 and the oscillator 107. How the signal is used will be described later.

The ASK circuit 106 is a modulation/demodulation circuit for performing amplitude modulation by ASK (Amplitude Shift Keying) on a signal transmitted from a not-shown reader/writer. When a signal is received, the ASK circuit 106 demodulates the signal and transmits the demodulated signal to the logic circuit 103. In the case where the logic circuit 103 transmits data using the transmitted reception signal as a trigger, the ASK circuit 106 performs the amplitude modulation.

The oscillator (ring oscillator) 107 is provided to generate an operation clock necessary when the logic circuit operates. In the embodiment, a ring oscillator which will be described later is used.

Figure 11:
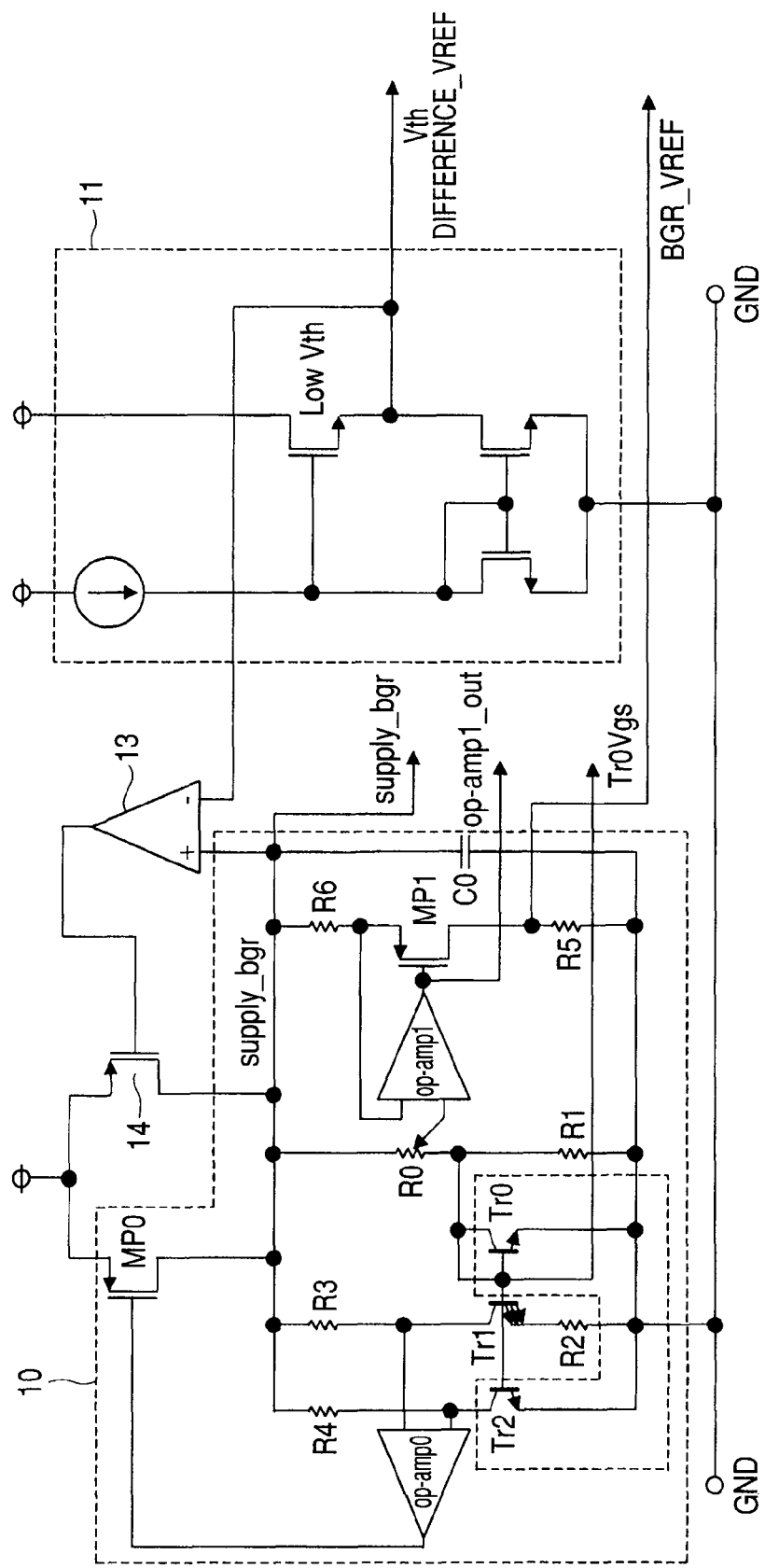
FIG. 11 is a circuit diagram showing the configuration of a BGR circuit and a Vth difference reference circuit, in a reference power supply related to the first embodiment of the invention.
Figure 12:
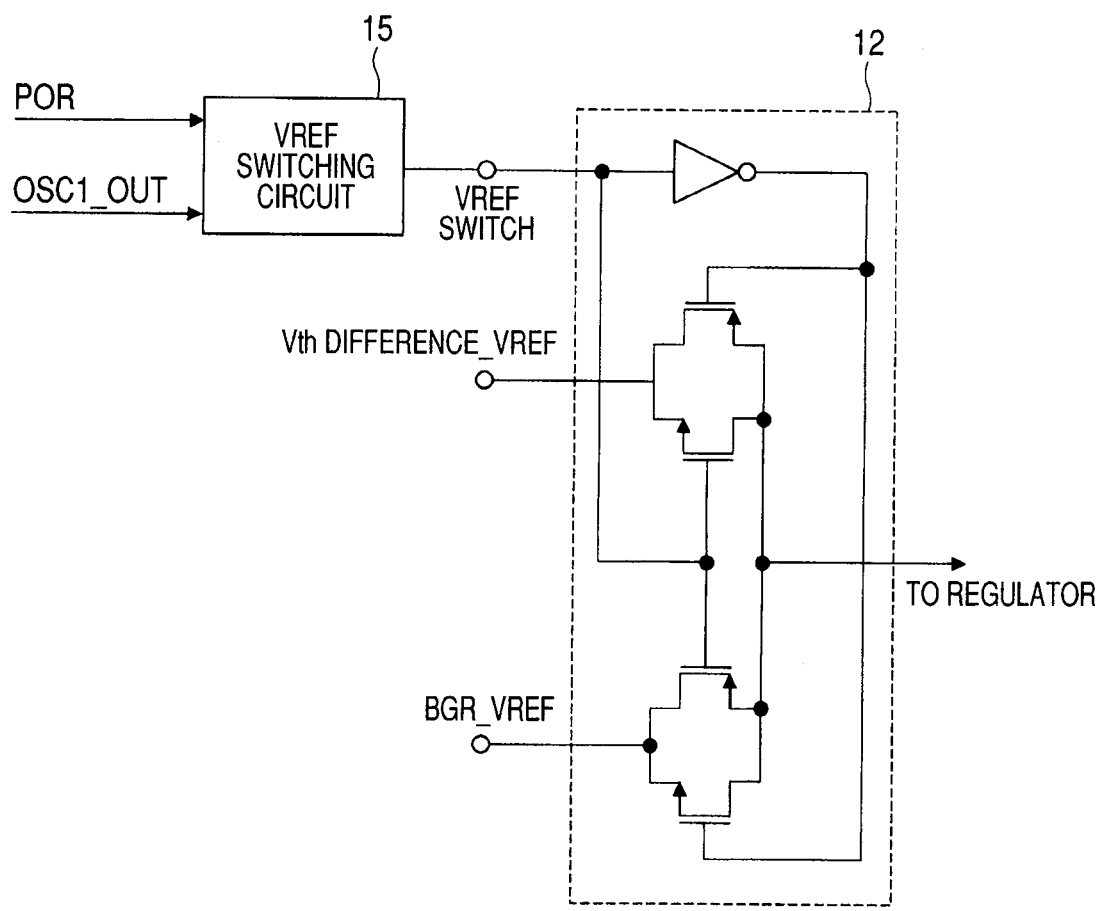
FIG. 12 is a circuit diagram showing the configuration of a switch in the reference power supply related to the first embodiment of the invention.

FIG. 11 is a circuit diagram showing the configuration of the BGR circuit 10 and the Vth difference reference circuit 11 in the reference power supply 100. FIG. 12 is a circuit diagram showing the configuration of the switch 12. Using the diagrams, the operation of the reference power supply 100 will be described.

The reference power supply includes a comparator 13 for comparing supply_bgr (reference potential in band gap reference) of the BGR circuit 10 and a Vth difference_VREF signal as an output of the Vth difference reference circuit 11, and a transistor 14 for coupling an output of the comparator to the gate terminal and operating as a switch.

The comparator 13 amplifies the difference between supply_bgr of the BGR circuit 10 and the output of the Vth difference reference circuit 11. In the case where the supply_bgr potential of the BGR circuit 10 is lower than the output of the Vth difference reference circuit 11, it is assumed that the BGR circuit 10 is not sufficiently started up, and current is passed from Vdd to the transistor 14. In such a manner, the supply_bgr potential is increased.

On the other hand, when the potential of supply_bgr becomes higher than the output of the Vth difference reference circuit 11, the voltage across the emitter terminal and the base terminal of the transistor 14 drops, and the current from Vdd does not flow via the transistor 14. It is assumed that the BGR circuit 10 starts and one of a BGR_VREF signal as a VREF output of the BGR circuit and the Vth difference_VREF signal to be used as the reference voltage is selected.

To the switch 12 shown in FIG. 12, the BGR_VREF signal and the Vth difference_VREF signal are input. Which one of the signals to be output to the regulator 12 is controlled by a VREF switch signal.

The VREF switch signal is a switch signal output from the VREF switching circuit 15 existing on the outside of the reference power supply 100.

The VREF switching circuit 15 is a switch that determines which one of the BGR_VREF signal or the Vth difference_VREF signal is to be output. To the VREF switching circuit 15, a POR (Power On Reset) signal output from the power-on-reset circuit 105 and an OCS1_OUT signal output from an oscillator are input.

The operations of the switch 12, the VREF switching circuit 15, and the like will be described below with reference to FIG. 13.

Figure 13:
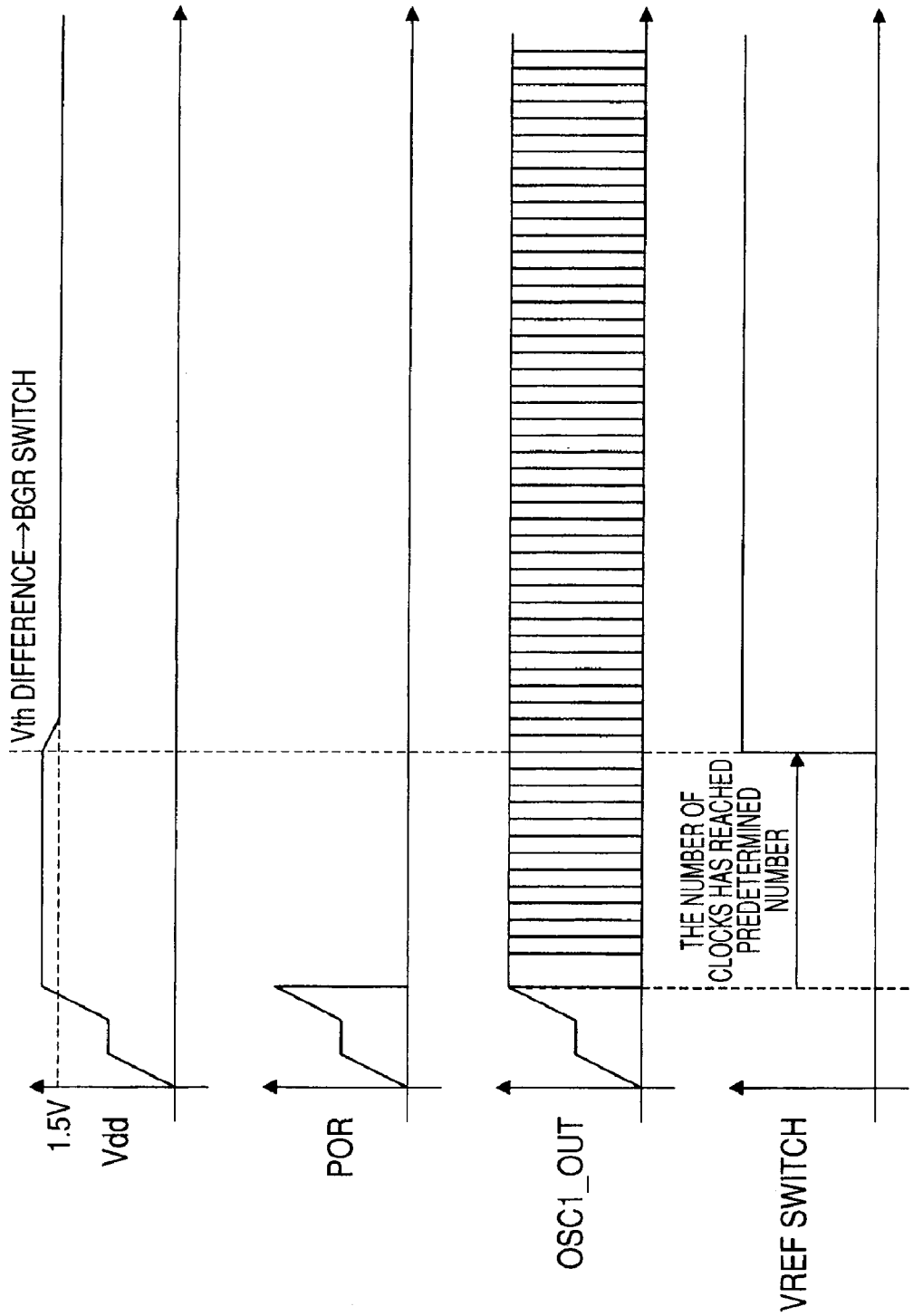
FIG. 13 is a waveform chart expressing changes with time of a switch and signals flowing in the switch.

FIG. 13 is a waveform chart expressing changes with time of the switch 12 and signals supplied to the switch 12.

At power on, a POR (power on reset) signal rises. While the POR signal is input, the VREF switching circuit 15 is reset, and the VREF switch signal is output as "0". While the POR signal is at the high level, the oscillator 107 to which a signal corresponding to the POR signal (OSC1_POR which will be described later) stops oscillating.

When the VREF switch signal is "0", a bidirectional switch on the side of the Vth difference_VREF signal of the switch 12 is on, and a switch on the BGR_VREF signal side is off. The regulator 102 controls Vdd in accordance with the Vth difference_VREF signal.

When the reset state is cancelled in the power-on-reset circuit 105 and the POR signal trails, the VREF switching circuit 15 and the oscillator 107 start operating, and the oscillator starts outputting clocks.

After start of the operation, the VREF switching circuit 15 starts counting an OSC1_OUT signal which is input. When the predetermined number of clocks are output, the VREF switching circuit 15 determines that the power supply voltage stably rises, and sets the VREF switch signal to "1". In response to it, the switch 12 switches the output from the Vth difference_VREF signal to the BGR_VREF signal. The regulator 102 controls Vdd in accordance with the BGR_REF signal.

By such operation, at the power on, Vdd is controlled by using the Vth difference_VREF signal. After that, Vcc can be controlled by using the high-precision BGR_VREF signal.

It has been described that the VREF switching circuit 15 exists on the outside of the reference power supply 100. However, the VREF switching circuit 15 may be included in the reference power supply 100.

The ring oscillator which will be described later (the ring oscillator 107 in FIG. 14) similarly stops oscillation by the POR signal (OSC1_POR in FIG. 14).

With such a configuration, different from a conventional startup circuit, no resistor is required. Therefore, the circuit with small mount area and small operation current can be realized.

In place of the POR signal, the inverted logic of the output of the comparator 13 may be used. In place of counting the OSC1_OUT signal, for example, a delay such as a time constant circuit using a resistor and a capacitor may be employed.

Concrete advantages obtained by the circuit configuration will be described below.

Figure 14:
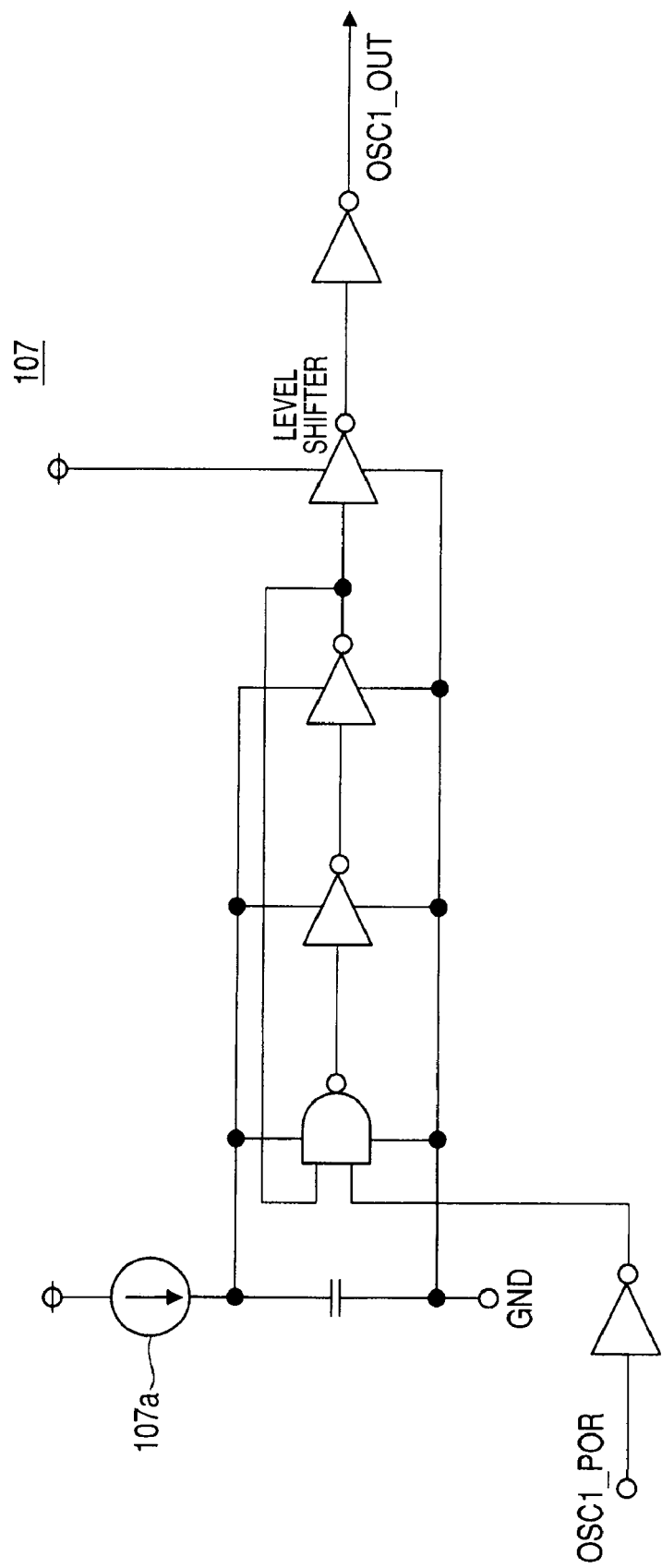
FIG. 14 is a circuit diagram showing a reference oscillation circuit using a ring oscillator (oscillator), which is used in the RFID tag chip related to the first embodiment of the invention.
Figure 15:
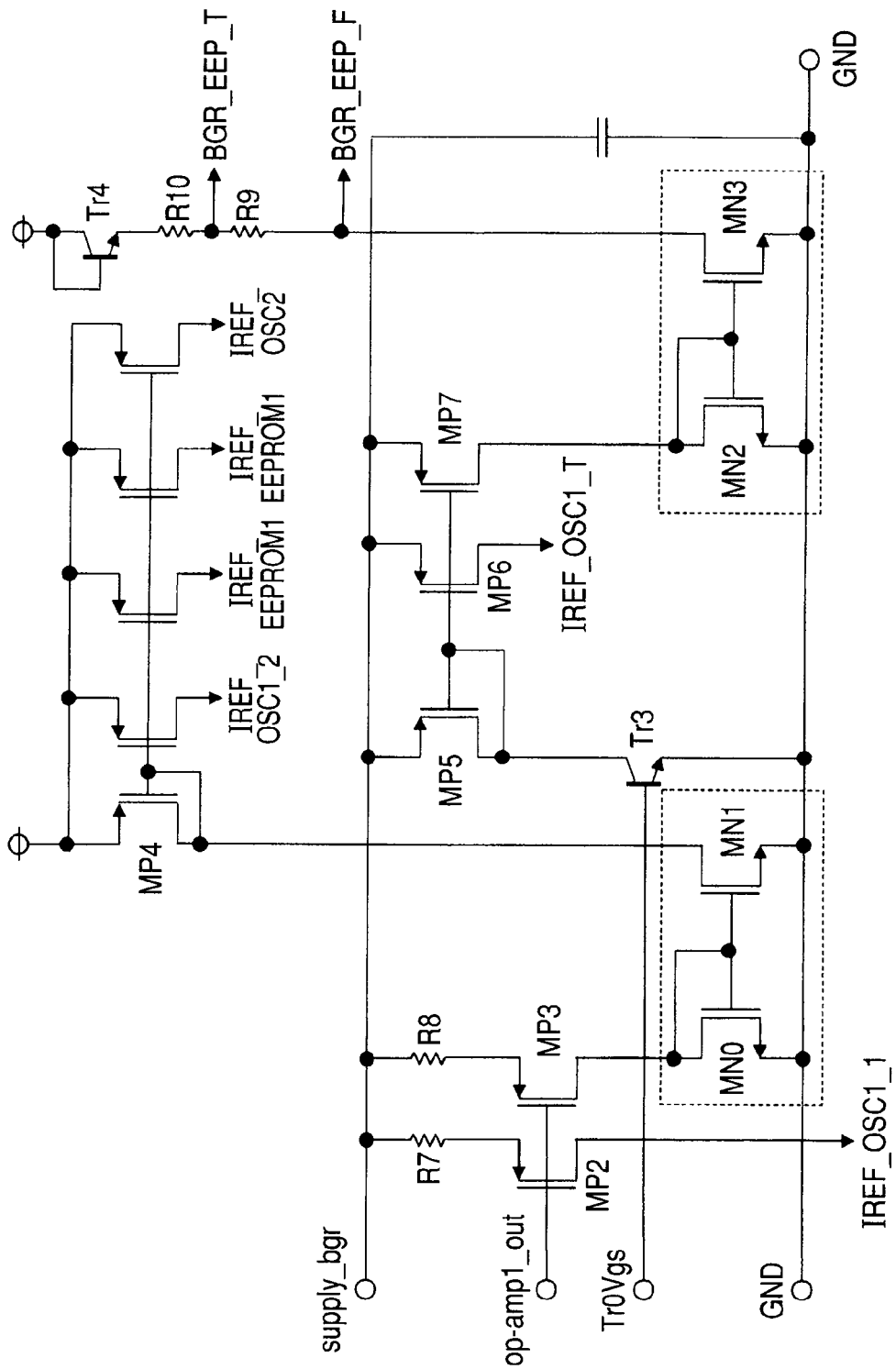
FIG. 15 is a circuit diagram showing the configuration of a part of the reference power supply for supplying reference voltage to the ring oscillator, which is used in the RFID tag chip related to the first embodiment of the invention.
Figure 16:
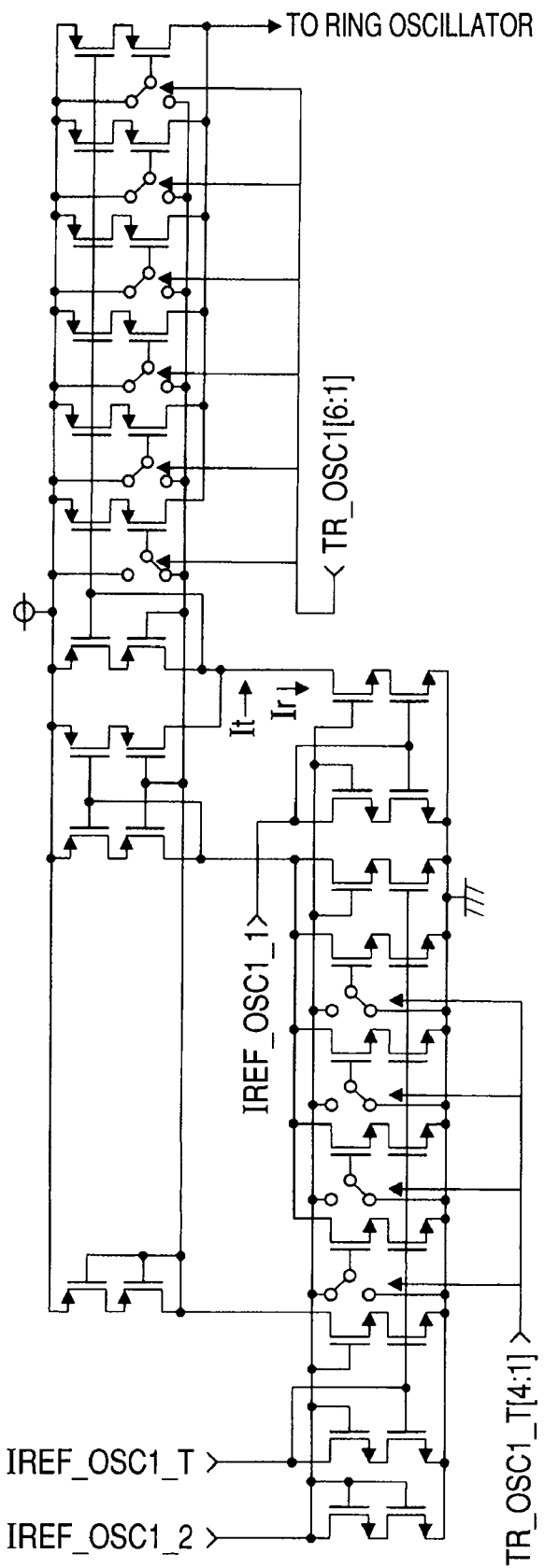
FIG. 16 is a circuit diagram expressing a current source used in the RFID tag chip related to the first embodiment of the invention.

FIG. 14 is a circuit diagram showing a reference oscillation circuit using the ring oscillator (oscillator) 107 used in the RFID tag chip. FIG. 15 is a circuit diagram showing the configuration of a part of the reference power supply 100 for supplying reference voltage to the ring oscillator 107. FIG. 16 is a diagram showing a current source used in the RFID tag chip.

By operating the ring oscillator 107 shown in FIG. 14 by the current source, the circuit of the RFID tag chip can oscillate extremely stable frequency against fluctuations in the power supply voltage. Since the oscillation is performed at a potential lower than the potential of Vdd, a level shifter is necessary for the output. Since the reference oscillation circuit always operates, a simple level shifter in which current flows even when the input signal stops is sufficient.

The ring oscillator 107 oscillates at a predetermined frequency as long as current and temperature do not change. There is, however, a problem such that even when the current is constant, if the temperature changes, the oscillation frequency changes. Consequently, to obtain predetermined oscillation frequency regardless of temperature, it is necessary to make the current source have the temperature characteristic which cancels out the temperature characteristic of the ring oscillator. OSC1_POR is a signal which drops from "1" to "0" on completion of the resetting operation at power-on, and has the same property as that of the POR signal in FIG. 12. When the OSC1_POR signal becomes "0", that is, when the resetting operation completes, the ring oscillator 107 normally starts operating.

An output of the ring oscillator is supplied to a circuit requiring an operation clock, for example, the VREF switching circuit 15 in FIG. 12.

A part of the circuits of the reference power supply 100 in FIG. 15 is a circuit for supplying reference current to a circuit which is influenced by the temperature characteristic such as the ring oscillator in FIG. 14.

The circuit is directed to extend the BGR circuit 10.

A part of the circuits of the reference power supply 100 receive the supply_bgr potential from the BGR circuit 10 in FIG. 12, an output signal of op-amp1, and Tr1Vgs supplied to the gate terminal of the transistor Tr0 as a component of the current mirror circuit.

The circuit is coupled to the transistor MP2 at a voltage drop from supply_bgr by a resistor R7. The gate terminal of the transistor MP2 is controlled by op_amp1 and the signal is supplied as an IREF_OSC1_1 signal to the current source. The IREF_OSC1_1 current signal has a small temperature characteristic and is stable against fluctuations in Vdd.

A current generated by a resistor R8 and a transistor MP3 using supply_bgr as a reference is transferred to a transistor MP4 by a current mirror circuit configured by the transistors MP0 and MP1. Using the current, an IREF_OSC1_2 current signal is generated. The IREF_OSC1_$_2$ current signal has a small temperature characteristic and, since a reference potential is Vdd, has a characteristic that it is susceptible to fluctuations in Vdd.

Using gate terminal potentials of two transistors of the current mirror circuit of the transistors Tr0 and Tr2 in FIG. 11, the gate of a transistor Tr3 is driven. A current flowing in the transistor Tr3 is output by the current mirror circuit, as an IREF_OSC1_T current signal. The temperature characteristic of the IREF_OSC1_T current signal is PTAT (Proportional To Absolute Temperature), and supply_bgr is used as a reference, so that the IREF_OSC1_T current signal is stable against fluctuations in Vdd.

To a part of the circuits in the reference power supply 100 shown in FIG. 15, the reference voltages BGR_EEP_T and BGR_EEP_F can be output. The signals are controlled on the basis of a signal based on the gate potential of the transistor Tr0 in the BGR circuit 10. The signals are reference potentials for controlling the negative voltage of the nonvolatile memory.

Since the nonvolatile memory is an element sensitive to temperature, when the nonvolatile memory has a proper temperature characteristic, good performance can be produced. With a configuration as shown in the diagram, the reference potentials having various temperature characteristics can be provided. It is shown in the diagram that BGR_EEP_T denotes a reference potential having a negative temperature characteristic, and BGR_EEP_F denotes a reference potential having a flat temperature characteristic. Since the two kinds of potentials are reference potentials at the time of generating a negative voltage, they are reference potentials of Vdd reference.

As described above, by performing extension as described above, signals having different temperature characteristics can be supplied to the EEPROM and the ring oscillator. Since which signal is to be used is a design matter of a circuit designer, it is not described here.

FIG. 16 shows a constant current source circuit used in the RFID tag chip. The constant current source is used as 107a in FIG. 14.

The IREF_OSC1_T signal used in the current source in the RFID tag chip in FIG. 16 and the like makes the current amount change with a setting of TR_OSC1_T[4:1], thereby generating "It".

On the other hand, IREF_OSC1_1 generates Ir by using the current mirror circuit. From It and Ir, current Ir-It is generated. With a setting of TR_OSC1_T[4:1], Ir-It can be provided with an arbitrary temperature characteristic.

Ir-It can be changed to an arbitrary current amount with a setting of TR_OSC1[6:1]. That is, by the setting of TR_OSC1 [6:1], the oscillation frequency of the ring oscillator 107 can be set. Further, by the setting of TR_OSC1_T[4:1], adjustment is made to cancel out the temperature characteristic of the ring oscillator 107.

Next, the necessity of making the temperature characteristic of the reference oscillation circuit used in the RFID tag chip or the like flat will be described.

Figure 17:
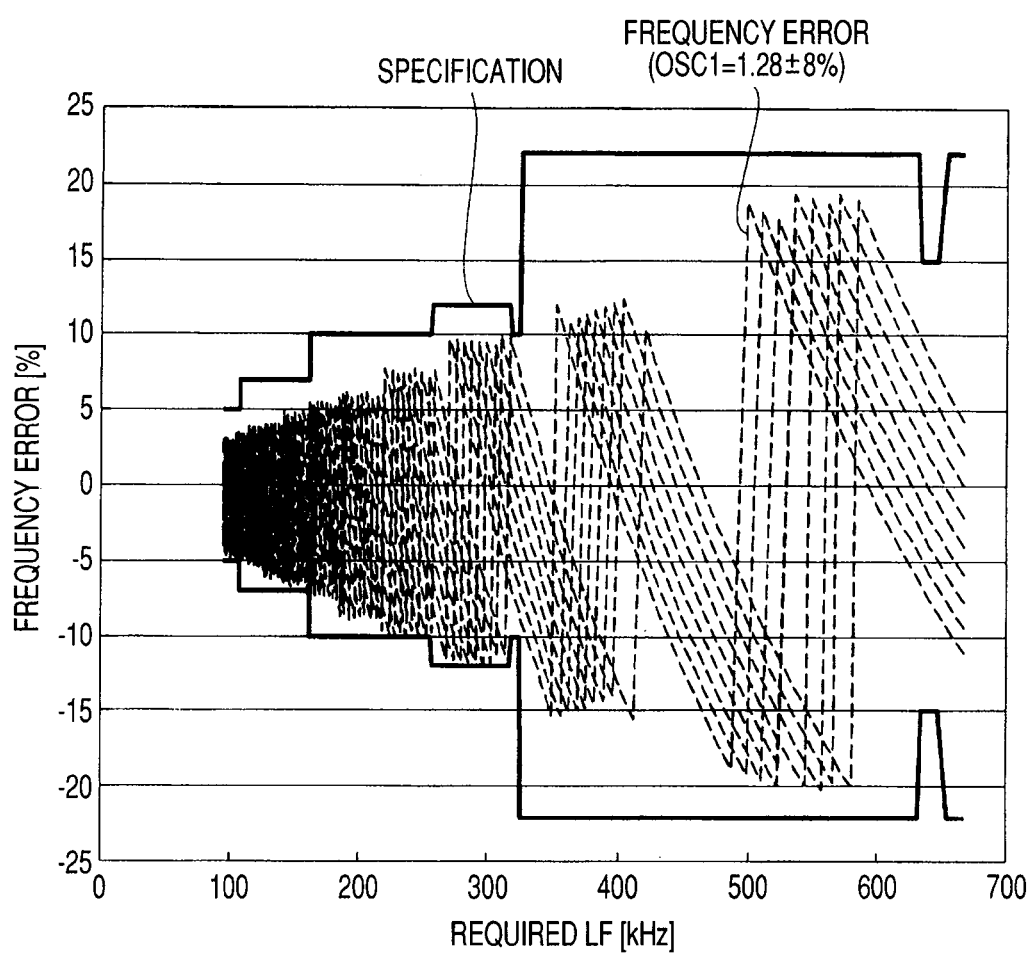
FIG. 17 is a graph showing an error in a transmission frequency (LF) in the case where the reference oscillation circuit is set to 1.28 MHz±8%.
Figure 18:
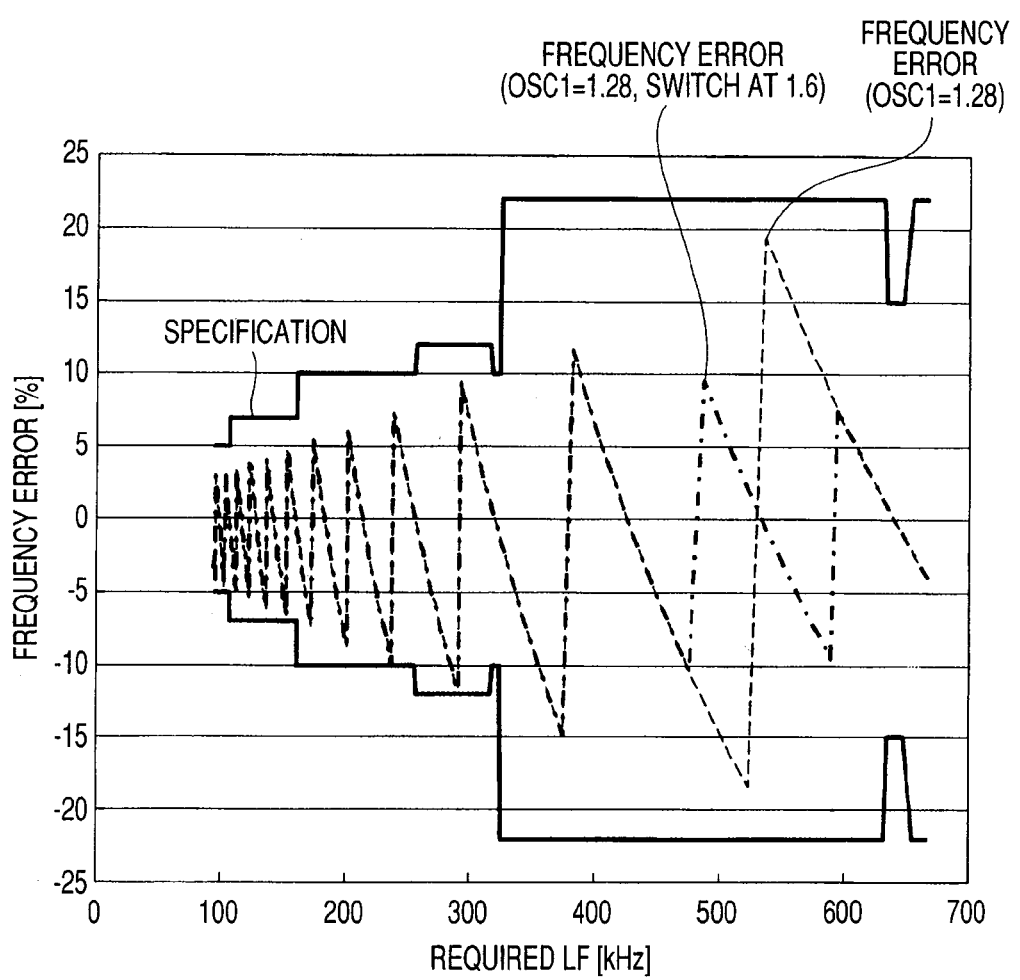
FIG. 18 is a graph showing an error in the transmission frequency (LF) in the case where the reference oscillation circuit is set to 1.28 MHz and the case where the reference oscillation circuit is switchable between 1.28 MHz and 1.6 MHz.

FIG. 17 is a graph showing an error in transmission frequency (LF) in the case where the reference oscillation circuit is set to 1.28 MHz±8%. FIG. 18 shows an error in the transmission frequency (LF) in the case where the reference oscillation circuit is set to 1.28 MHz and the case where the reference oscillation circuit is switchable between 1.28 MHz and 1.6 MHz.

Since the transmission frequency (LF) is generated by frequency-dividing the reference oscillation frequency, if signals are transmitted at a speed different from the frequency division of the reference oscillation frequency, an error occurs.

As understood from FIG. 17, in the EPC global C1G2 standard, the severity of the error in the transmission speed varies according to the LF. To satisfy the standard, the reference frequency is determined to avoid the severe part. However, when the reference frequency changes above a level, the standard cannot be satisfied. It becomes therefore necessary to make the temperature characteristic flat.

If the standard cannot be satisfied even when the temperature characteristic is made flat by using the PTAT current or the like of the BGR circuit 10, by switching a plurality of oscillation frequencies as shown in FIG. 18, an error in LF can be reduced. At this time, switching of the frequency may be obtained by calculation from a trimming value, or a plurality of trimming values may be prepared.

As described above, by using generating an arbitrary temperature characteristic by using the PTAT and NTAT currents of the BGR circuit 10, the temperature characteristic of the reference oscillation circuit can be cancelled off.

Second Embodiment

A second embodiment of the present invention will now be described with reference to the drawings.

The Vth difference reference circuit used in the first embodiment does not have to generate a high-precision reference voltage as long as it can realize prompt rise.

Figure 19:
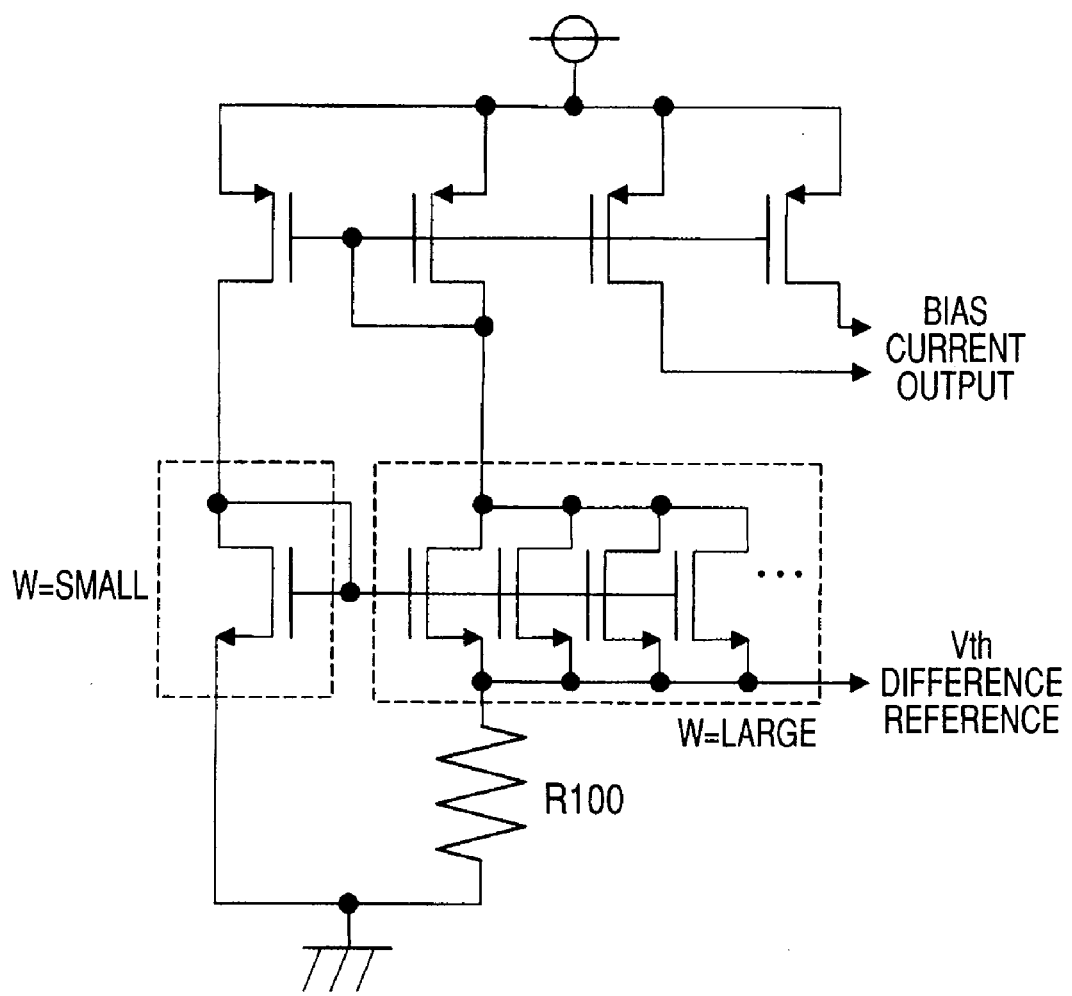
FIG. 19 is a diagram showing a circuit for generating constant current called a Widlar current source used in a second embodiment of the invention.

FIG. 19 is a diagram showing a circuit for generating constant current called a Widlar current source used in a second embodiment of the invention. The Widlar current source is a circuit generally used in the field of LSIs.

The Widlar current source is a circuit for passing the same current to a MOS-FET having a large gate width W and a MOS-FET having a small width W (in the diagram, expressed as parallel MOS-FETs) by a current mirror circuit, and sending the Vgs difference of the MOS-FETs and a resistance value of R100 as a feedback so that the current becomes constant regardless of the power supply voltage.

Since the Vgs difference of the Widlar current source is constant regardless of the power supply voltage, it can be used in place of the Vth difference reference circuit.

The reference voltage generating circuit can almost eliminate the source voltage dependency except for channel length modulation of a MOS. However, even the reference voltage generating circuit still has the temperature dependency. It also has dependency on manufacture variations in MOSs like in the Vth difference reference circuit. Consequently, the precision of the reference voltage generating circuit is lower than that of the Vth difference reference circuit. However, as described above, in the present invention, the precision of the Vth difference reference circuit does not exert much influence on the precision of an RFID tag chip. Therefore, the Vth difference reference circuit can be used without a problem.

By using the Widlar current source, reduction in the circuit area and power consumption can be realized. There is also an advantage from the viewpoint of mounting such that the Widlar current source can be configured only by standard elements without requiring a special element such as a low Vth MOS.

The invention achieved by the inventors of the present invention has been described on the basis of the embodiments. Obviously, the present invention is not limited to the foregoing embodiments but can be variously modified without departing from the gist.

The present invention has been described on assumption of use in an RFID tag chip but is not limited to the use. The invention can be applied to a noncontact IC card as a technique of the same kind, a portable device having no stable current source, and a noncontact charging mechanism which does not transmit/receive data.

What is claimed is:

1. A semiconductor device comprising:
   a reference voltage generating circuit including a first reference voltage generating circuit, a second reference voltage generating circuit, and an output switch for switching between an output of the first reference voltage generating circuit and an output of the second reference voltage generating circuit,
   wherein the output switch switches between an output of the second reference voltage generating circuit and an output of the first reference voltage generating circuit in accordance with an input switch signal,
   wherein the second reference voltage generating circuit is a threshold-difference-using-type reference voltage generating circuit which uses the difference between two kinds of thresholds of metal oxide semiconductor (MOS-FET),
   a comparator for detecting a potential difference between an output of the threshold-difference-using-type reference voltage generating circuit and a reference potential in a band gap reference of a band gap reference circuit; and
   a transistor,
   wherein when the reference potential in the band gap reference is smaller than the output of the threshold-difference-using-type reference voltage generating circuit, current flows in the transistor to increase the reference potential in the band gap reference.

2. A semiconductor device comprising,
   a reference voltage generating circuit including a first reference voltage generating circuit, a second reference voltage generating circuit, and an output switch for switching between an output of the first reference voltage generating circuit and an output of the second reference voltage generating circuit,
   wherein the output switch switches between an output of the second reference voltage generating circuit and an output of the first reference voltage generating circuit in accordance with an input switch signal,
   wherein the second reference voltage generating circuit is a threshold-difference-using-type reference voltage generating circuit which uses the difference between two kinds of thresholds of metal oxide semiconductor (MOS-FET),
   a comparator for detecting a potential difference between an output of the threshold-difference-using-type reference voltage generating circuit and a reference potential in a band gap reference of the band gap reference circuit; and
   a transistor,
   wherein when the reference potential in the band gap reference is smaller than the output of the threshold-difference-using-type reference voltage generating circuit, current flows in the transistor to increase the reference potential in the band gap reference,
   wherein the band gap reference circuit outputs a reference voltage of a reference oscillation circuit by using the reference potential in the band gap reference,
   wherein the band gap reference circuit cancels temperature dependency of the reference potential in the band gap reference by an operational-amplifier-type band gap reference circuit and the transistor.

3. An RFID tag chip comprising the reference voltage generating circuit described in claim 1,
   wherein an output of the reference voltage generating circuit is used as a reference voltage of a regulator, and a power supply voltage is output from a rectifier circuit.

4. An RFID tag chip comprising the reference voltage generating circuit described in claim 2,
   wherein an output of the reference voltage generating circuit is used as a reference voltage of a regulator, and a power supply voltage is output from a rectifier circuit.

5. An RFID tag chip comprising:
   a reference voltage generating circuit including a first reference voltage generating circuit, a second reference voltage generating circuit, and an output switch for switching between an output of the first reference voltage generating circuit and an output of the second reference voltage generating circuit,
   wherein the output switch switches between an output of the second reference voltage generating circuit and an output of the first reference voltage generating circuit in accordance with an input switch signal,
   wherein the second reference voltage generating circuit is a threshold-difference-using-type reference voltage generating circuit which uses the difference between two kinds of thresholds of metal oxide semiconductor (MOS-FET),
   a comparator for detecting a potential difference between an output of the threshold-difference-using-type reference voltage generating circuit and a reference potential in a band gap reference of the band gap reference circuit; and
   a transistor,
   wherein when the reference potential in the band gap reference is smaller than the output of the threshold-difference-using-type reference voltage generating circuit, current flows in the transistor to increase the reference potential in the band gap reference,
   wherein an output of the reference voltage generating circuit is used as a reference voltage of a regulator, and a power supply voltage is output from a rectifier circuit.

6. An RFID tag chip comprising:
   a reference voltage generating circuit including a first reference voltage generating circuit, a second reference voltage generating circuit, and an output switch for switching between an output of the first reference voltage generating circuit and an output of the second reference voltage generating circuit,
   wherein the output switch switches between an output of the second reference voltage generating circuit and an output of the first reference voltage generating circuit in accordance with an input switch signal,
   wherein the second reference voltage generating circuit is a threshold-difference-using-type reference voltage generating circuit which uses the difference between two kinds of thresholds of metal oxide semiconductor (MOS-FET),
   a comparator for detecting a potential difference between an output of the threshold-difference-using-type reference voltage generating circuit and a reference potential in a band gap reference of the band gap reference circuit; and a transistor, wherein when the reference potential in the band gap reference is smaller than the output of the threshold-difference-using-type reference voltage generating circuit, current flows in the transistor to increase the reference potential in the band gap reference, wherein the band gap reference circuit outputs a reference voltage of a reference oscillation circuit by using the reference potential in the band gap reference, wherein an output of the reference voltage generating circuit is used as a reference voltage of a regulator, and a power supply voltage is output from a rectifier circuit.

7. The semiconductor device according to claim 1, wherein the switch signal is output from the reference voltage generating circuit, and wherein the output switch detects an input clock signal and switches the switch signal.

8. The semiconductor device according to claim 2, wherein the switch signal is output from the reference voltage generating circuit, and wherein the output switch detects an input clock signal and switches the switch signal.

9. The RFID tag chip according to claim 5, wherein the switch signal is output from the reference voltage generating circuit, and wherein the output switch detects an input clock signal and switches the switch signal.

10. The RFID tag chip according to claim 6, wherein the switch signal is output from the reference voltage generating circuit, and wherein the output switch detects an input clock signal and switches the switch signal.

* * * * *